(12) United States Patent
Cheng et al.

(10) Patent No.: US 7,147,721 B2
(45) Date of Patent: Dec. 12, 2006

(54) APPARATUS AND METHOD FOR CLEANING ELECTRONIC PACKAGES

(75) Inventors: Chi Wah Cheng, Kwai Chung (HK); Yui Ko Wong, Kwai Chung (HK); Tim Wai Mak, Kwai Chung (HK)

(73) Assignee: ASM Assembly Automation Ltd., Kwai Chung (HK)

( * ) Notice: Subject to any disclaimer, the term of this patent is extended or adjusted under 35 U.S.C. 154(b) by 455 days.

(21) Appl. No.: 10/698,379

(22) Filed: Nov. 3, 2003

(65) Prior Publication Data

US 2004/0123878 A1    Jul. 1, 2004

Related U.S. Application Data

(60) Provisional application No. 60/436,659, filed on Dec. 30, 2002.

(51) Int. Cl.
*B08B 3/10* (2006.01)
(52) U.S. Cl. .................. 134/1; 134/135; 134/184; 134/186
(58) Field of Classification Search .......... 134/1, 134/135, 182, 183, 184, 186
See application file for complete search history.

(56) References Cited

U.S. PATENT DOCUMENTS 4,370,356 A * 1/1983 Bok et al. ................ 427/534
4,521,092 A * 6/1985 Ferrante .................... 396/617
5,339,842 A * 8/1994 Bok .............................. 134/1
5,601,655 A    2/1997 Bok et al.
6,165,232 A    12/2000 Tieber et al.
6,187,654 B1   2/2001 Tieber
6,325,059 B1   12/2001 Tieber
6,506,260 B1 * 1/2003 Hiraishi et al. ............. 134/15
2002/0133971 A1 9/2002 Cheung et al.

FOREIGN PATENT DOCUMENTS

JP    03-077319 A      4/1991
KR    1992-0003879   * 5/1992
KR    1992-0003879 B1  5/1992

* cited by examiner

*Primary Examiner*—Michael Barr
*Assistant Examiner*—Saeed Chaudhry
(74) *Attorney, Agent, or Firm*—Buchanan Ingersoll & Rooney PC

(57) ABSTRACT

The invention provides an apparatus and method for cleaning a plurality of electronic components. A tank is provided for containing a cleaning fluid and an ultrasonic resonator is mounted in communication with the cleaning fluid for charging ultrasonic energy thereto. A support platform positionable over a top surface of the cleaning fluid supports the electronic components such that the electronic components are in contact with said top surface of the cleaning fluid in use. Further, a cleaning fluid supply system is configured to generate a continuous flow of cleaning fluid into the tank for cleaning the electronic components in contact with said top surface of the cleaning fluid.

23 Claims, 4 Drawing Sheets

APPARATUS AND METHOD FOR CLEANING ELECTRONIC PACKAGES

FIELD OF THE INVENTION

The invention relates to the cleaning of a plurality of electronic components, such as electronic packages, especially after the packages have been singulated after a cutting process, although such cleaning can also be applied before singulation.

BACKGROUND AND PRIOR ART

Due to the small size of present generations of semiconductor or electronic packages and in order to achieve economies of scale, a plurality of electronic packages are formed on a single substrate during manufacture of the packages. Such plurality of packages are sometimes separated by sawing after they are molded to protect the integrated circuits comprised in the packages, such as in the case of Chip-Scale Ball-Grid Array ("CSBGA") packages. Since sawn residue in the form of dirt and small particles of contamination is created during sawing, handling of sawn (separated) CSBGA packages includes cleaning after sawing. A top side of the sawn packages is usually cleaned by cooling water applied to the packages during the sawing process. The cooling water serves not only to cool the saw blades and packages, but also to wash away residue formed during sawing. However, a bottom side of the packages cannot be cleaned in this way as the bottom side is resting on vacuum pads of a saw jig or other attachment surface to hold the packages during sawing, and are in close contact with the attachment surfaces. This contact limits the effectiveness of cleaning in this way.

There are generally two approaches that are typically adopted when handling the sawn packages, namely a nesting approach and a non-nesting approach. The nesting approach is illustrated by U.S. Pat. No. 6,165,232 ("Method and Apparatus for Securely Holding a Substrate during Dicing"), U.S. Pat. No. 6,187,654 ("Techniques for Maintaining Alignment of Cut Dies during Substrate Dicing") and U.S. Pat. No. 6,325,059 ("Techniques for Dicing Substrates during Integrated Circuit Fabrication"). Generally, a nesting mechanism, which includes a grid arrangement that defines openings which receive the plurality of packages, is arranged to support a substrate having a plurality of packages during a dicing process. Using this nesting mechanism, the plurality of electronic packages may be lifted after dicing. Using the nesting approach, adoption of water jets positioned above and below the raised nesting mechanism holding the sawn packages is a common method for cleaning both top and bottom sides of the packages.

A problem with this method of cleaning sawn packages is that the grid structure may block the water jets from reaching certain portions of the packages. As a result, washing may not be thorough. Furthermore, the smaller the packages, the more difficult it is to hold the packages properly during washing with pressurized water jets.

The non-nesting approach is illustrated by US patent publication number 2002/0133971, where there is no grid arrangement to hold the individual sawn packages and the sawn packages are not lifted. For the non-nesting approach, running water introduced from below the packages may be used to rinse the bottom side of the separated packages by supplying water or other cleaning fluid through fluid inlets in a platform supporting the packages. As a result, the bottom side of the packages is rinsed by this operation.

However, cleaning the bottom side of separated packages just by using running water is a rather gentle way to wet the bottom surface and dilute the dirt and contamination adhering onto the bottom surfaces of the packages. If the dirt or contamination is sticky, this method cannot thoroughly remove all the dirt or contamination.

SUMMARY OF THE INVENTION

Thus, it is an object of the invention to seek to provide an improved apparatus and method for cleaning a plurality of electronic packages by supplying water or other cleaning fluid charged with ultrasonic energy to the packages.

According to a first aspect of the invention, there is provided an apparatus for cleaning a plurality of electronic components, comprising: a tank for containing a cleaning fluid; an ultrasonic resonator mountable in communication with the cleaning fluid for charging ultrasonic energy thereto; a support platform positionable over a top surface of the cleaning fluid for supporting the electronic components such that the electronic components are in contact with said top surface of the cleaning fluid in use; and a cleaning fluid supply system for generating a continuous flow of cleaning fluid into the tank for cleaning the electronic components in contact with said top surface of the cleaning fluid.

According to a second aspect of the invention, there is provided a method for cleaning a plurality of electronic components, comprising the steps of: providing a tank containing a cleaning fluid; ultrasonically charging the cleaning fluid; supporting the electronic components such that the electronic components are in contact with a top surface of the cleaning fluid; and generating a continuous flow of cleaning fluid into the tank for cleaning the electronic components in contact with said top surface of the cleaning fluid.

It will be convenient to hereinafter describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of preferred embodiments of an apparatus and method in accordance with the invention will now be described with reference to the accompanying drawings, in which.

DETAILED DESCRIPTION OF THE PREFERRED EMBODIMENT

Figure 1:
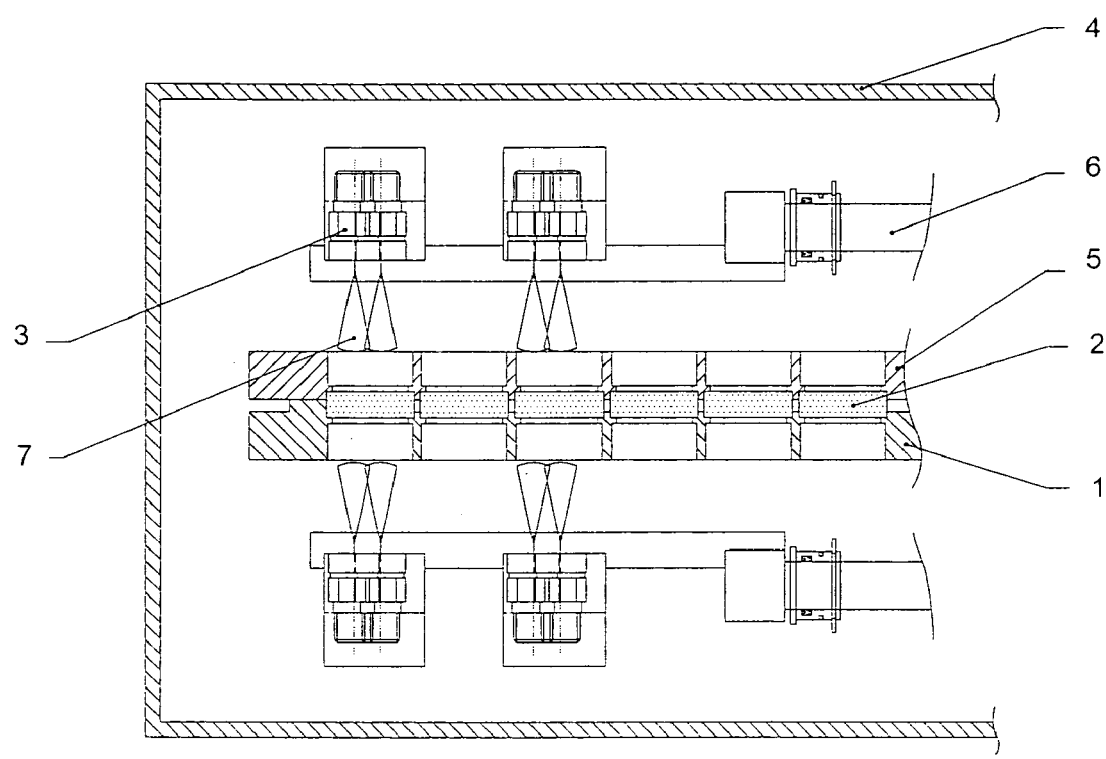
FIG. 1 shows a sectional side view of a prior art cleaning method of applying water jets onto top and bottom sides of electronic packages held by upper and lower grids of a nesting mechanism used in conjunction with a nesting approach.

FIG. 1 shows a sectional side view of a prior art cleaning method of applying water jets 7 onto top and bottom sides of electronic packages 2 held by upper and lower grids 5, 1 of a nesting mechanism used in conjunction with a nesting approach. The cleaning method is performed by discharging pressurized water jets 7 through fluid nozzles 3 onto the packages held by the upper and lower grids 5, 1. The fluid nozzles 3 are supported by a nozzle support 6, and the apparatus may be housed within a cleaning chamber 4. Due to blockage by the grids 5, 1, cleaning by water jets may not be thorough.

Figure 2A:
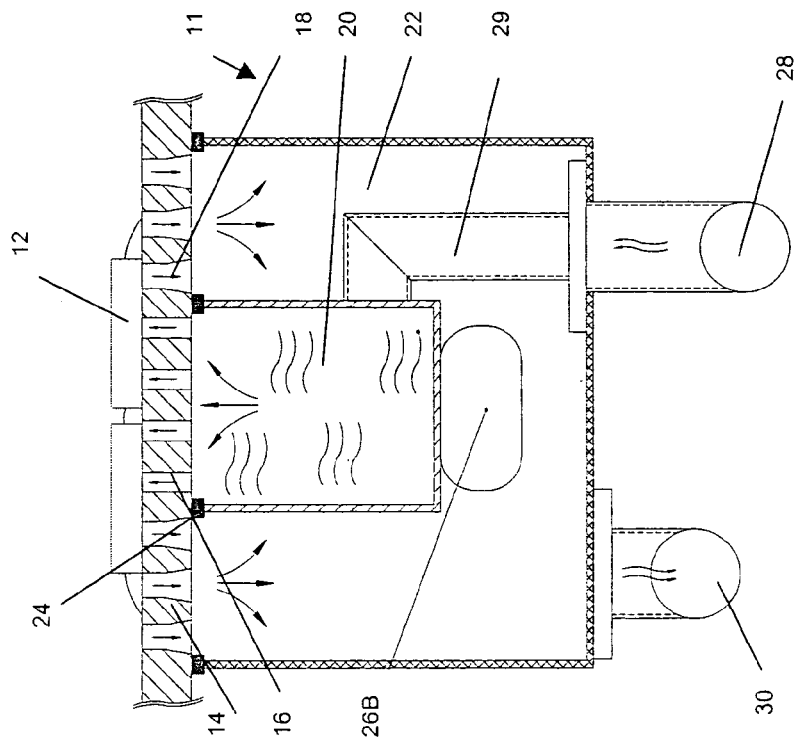
FIG. 2a shows a sectional side view of a cleaning apparatus according to a preferred embodiment of the invention, wherein the electronic packages are supported on top of a support platform, and an ultrasonic resonator is immersed inside a tank containing a cleaning fluid, such as water.

FIG. 2a shows a sectional side view of a cleaning apparatus 10 according to a preferred embodiment of the invention. In the described embodiment, the apparatus 10 is constructed based on the non-nesting approach of US patent publication number 2002/0133971. The apparatus 10 is designed particularly to clean a bottom side of the electronic components that are being handled by this non-nesting approach, although it is not intended to be limited to cleaning the bottom side of the electronic components.

The apparatus comprises a rinsing or support platform 14 which supports a plurality of electronic components, in the form of electronic packages 12, on top of the support platform 14. The support platform 14 has a number of holes that may be divided into fluid inlets 16 where a cleaning fluid (which shall be conveniently referred to as "water" in the rest of the description, although other fluids are also applicable), is introduced to the packages 12, and fluid outlets 18, where the water carrying dirt and other residue is carried away from the packages 12.

In this embodiment, the support platform 14 is mounted onto a rim of an inner tank 20 which is filled with water, so that the support platform 14 is positioned over a top surface of the water. The fluid inlets 16 are in communication with the water such that water is allowed to diffuse onto the top surface of the support platform 14. Thus, the top surface of the water is raised to extend onto the top surface of the support platform 14 and is in contact with the electronic packages 12 on the platform 14.

The inner tank 20 is surrounded by an outer tank 22 placed adjacent to the inner tank 20. The outer tank 22 is adapted to collect water drained through the fluid outlets 18 adjacent to the fluid inlets 16 of the support platform 14. Water drainage is provided by an output channel 30 connected to the outer tank 22. The rate of water drainage may be improved by providing vacuum suction to the outer tank 22 using vacuum suction (not shown). In turn, the rate of removing dirt and small particles away from the sawn packages is further enhanced to improve cleaning effectiveness. The inner tank 20 may be sealed from the outer tank 22 by using O-rings 24 to seal the inner tank 20 to the support platform 14.

An ultrasonic resonator 26A is immersed into the water within the inner tank 20 containing water so that it is in communication with and charges ultrasonic energy to the water. At the same time, a water supply system, such as a water pump 28, generates and continuously introduces water into the inner tank 20 to maintain a constant flow of water through the fluid inlets 16 for contacting and cleaning the electronic packages 12.

Therefore, using a running water concept for bottom side cleaning, ultrasonic energy is applied to the water under the support platform 14 by the ultrasonic resonator 26A. Water is continuously introduced by the water pump 28 into the inner tank 20 so that water fills up the inner tank 20 and diffuses through the rows of fluid inlets 16 of the support platform 14 to reach the bottom side of the sawn packages 12 in a uniform manner. In the meantime, the resonator 26A is activated to generate ultrasound waves in the water such that ultrasonic energy can reach the bottom surfaces of sawn packages 12 in a uniform manner through this continuous flow of water. Therefore, ultrasound cleaning can be generated directly to the packages.

Ultrasound is an efficient and effective method in removing dirt and small particles adhering on surfaces to be cleaned. However, it was found that to make use of ultrasound cleaning, it is more effective to continuously carry the removed dirt and small particles away from the surfaces to be cleaned. It would be appreciated that the continuous flow of water maintains the top surface of the cleaning fluid or water at a level higher than the rim of the inner tank 20. Doing so enables the water to continuously overflow the inner tank 20 to continuously carry removed dirt and small particles away from the surface to be cleaned so that a cleaned surface can be maintained and re-sticking of removed dirt and small particles can be avoided.

Moreover, by continuously supplying water from the inner tank 20, a uniform amount of water is applied to the bottom surfaces of the packages 12 to form a layer of water and close contact between the water and the bottom surfaces of the packages is maintained. The water pump 28 is therefore made to supply an adequate flow of water to the inner tank 20 to maintain the uniform amount of water in contact with the electronic packages 12 on the surface of the platform. As a result, ultrasound energy can be effectively transmitted from the resonator 26A to the bottom surfaces of the packages 12 for carrying out thorough cleaning.

Figure 2B:
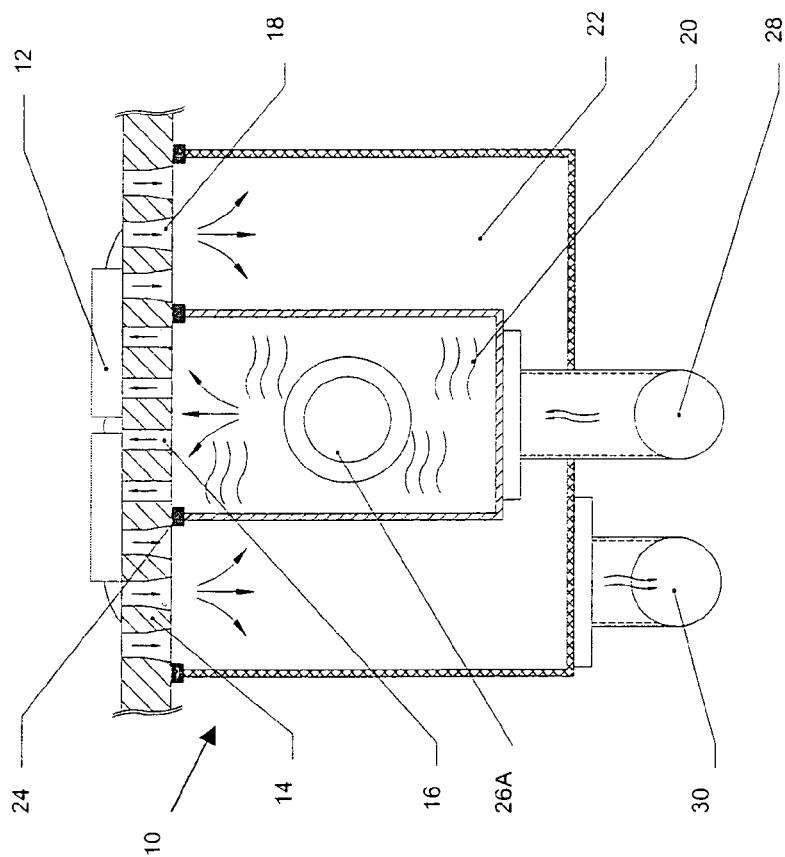
FIG. 2b shows another preferred embodiment of the invention, wherein an ultrasonic resonator is attached to an external surface of the bottom or side wall of a tank containing the cleaning fluid.

FIG. 2b shows another preferred embodiment of the cleaning apparatus 11 of the invention, wherein an ultrasonic resonator 26B is attached to an external surface of the bottom or side wall of the inner tank 20 containing the cleaning fluid or water. This may be done using adhesive, mounting brackets, welding, or any other means as long as the ultrasonic resonator 26B is in communication with the cleaning fluid through close contact with the wall of the inner tank 20 containing the cleaning fluid.

It is similar to the first embodiment, except that the resonator 26B is not put inside the inner tank 20. This method may not be as effective as immersing the resonator 26B inside the inner tank 20, in terms of ultrasound transmission efficiency. However, it reduces the possible risk of water leakage into the immersed ultrasound resonator through prolonged use or other reasons. This type of ultrasound resonator 26B that does not have to be as resistant to water damage is more easily available in industry.

Figure 3:
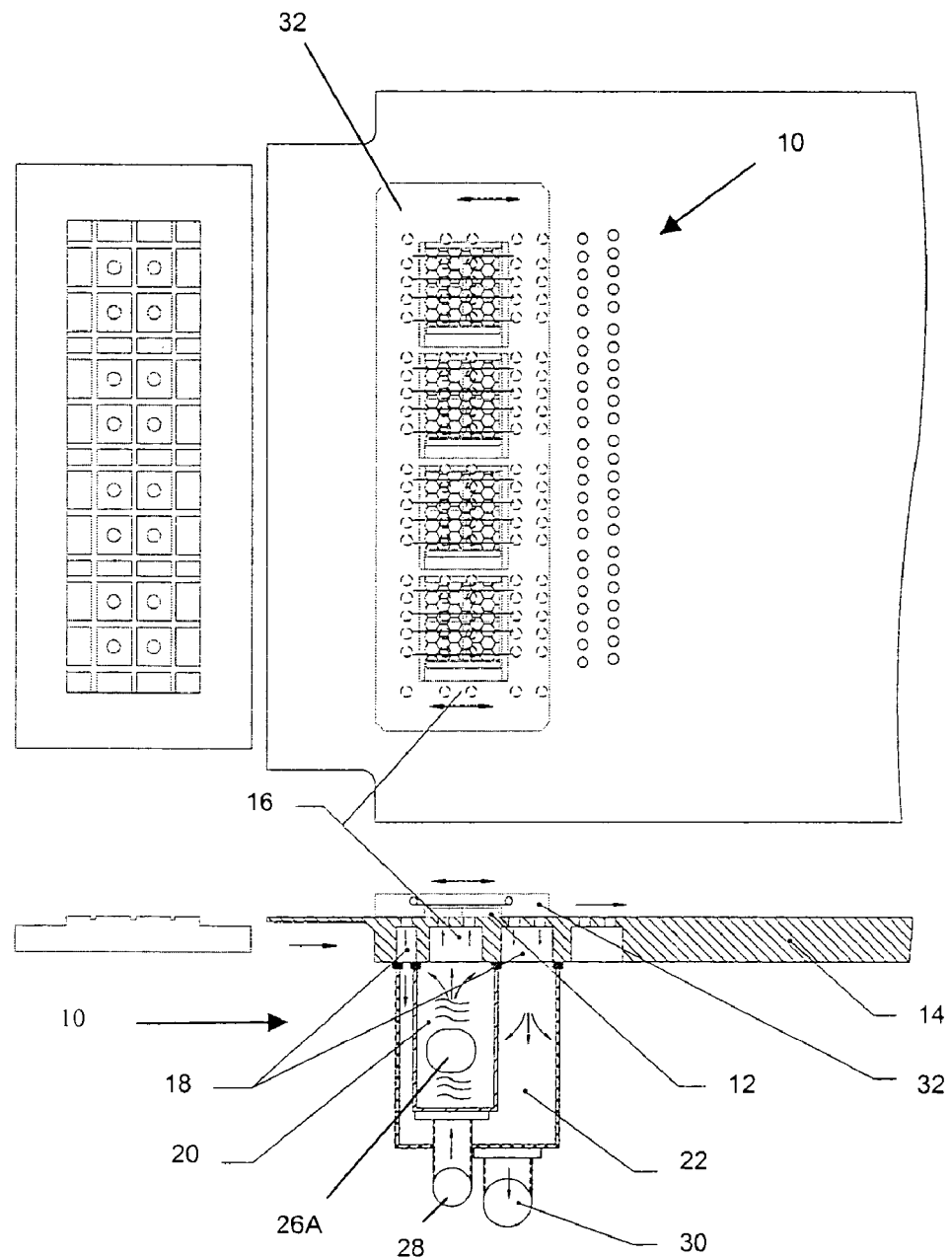
FIG. 3 shows how the first and second embodiments can be applied in relation to the non-nesting approach of handling sawn packages.

FIG. 3 shows how the first and second embodiments can be applied in relation to the non-nesting approach of handling sawn packages 12. A side view of the apparatus 10 similar to that of FIG. 2a is shown together with a top view of the apparatus 10 with the packages 12 in the same position. The packages 12 are positioned onto the surface of the support platform 14 by a transferring device 32. They are held by the transferring device 32 and repeatedly moved sideways laterally relative to the top surface of the water by a moving mechanism operating in conjunction with the transferring device when performing cleaning. The repeated movement is to assist in the detachment of dirt and small particles from the packages 12 in order to achieve a more thorough cleaning.

Although various types and frequencies of ultrasound energy can be applied, a frequency of about 20–80 KHz is perferred, as it is found to provide more effective cleaning in respect of dirt and small particles of about a few to tens of micrometers in diameter that are created during the sawing process The inner tank 20 and outer tank 22 are preferably made from stainless steel or other stable metal. The support platform 14 is preferably made from aluminum with hard anodizing or stainless steel or other stable metal. As a result, they are reliable even if exposed to ultrasound and water or other cleaning fluid for a prolonged period of time.

Figure 4:
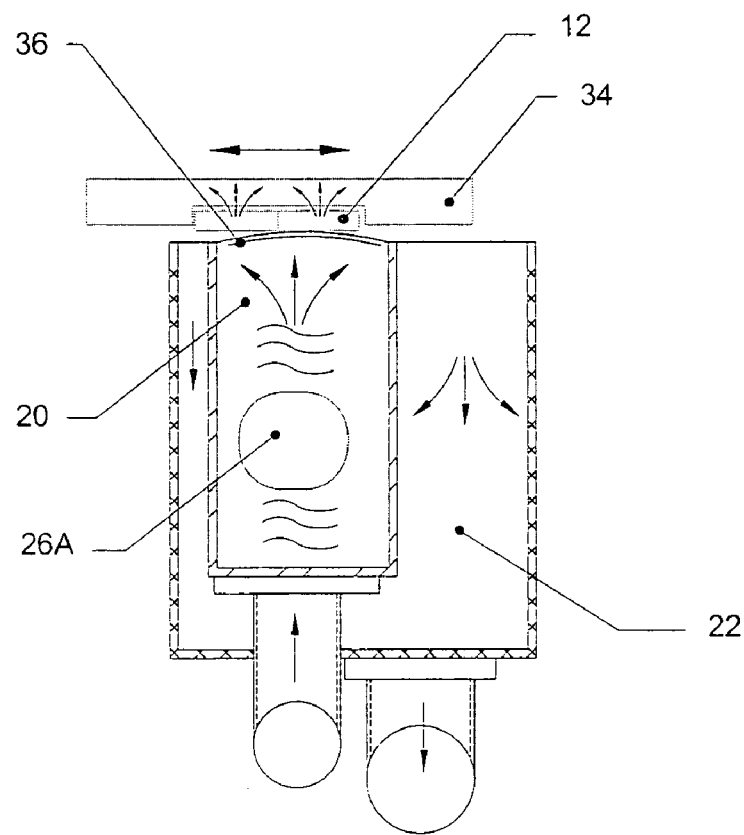
FIG. 4 shows a third embodiment of the invention, wherein electronic packages to be cleaned are held facing the tank of cleaning fluid.

FIG. 4 shows a third embodiment of the invention, wherein electronic packages 12 to be cleaned are supported on a support platform in the form of a pick head 34 and held facing the top surface of the water in the inner tank 20. An ultrasonic transducer 26A may be immersed in the water as in the first embodiment (as illustrated) or attached to a side or bottom of the inner tank 20 as in the second embodiment. The pick head 34 is used to hold the electronic packages 12 facing the water utilizing any suitable means, for example, by vacuum suction from a vacuum suction device (not shown) connected to the pick head 34. The ultrasonic transducer 26A in the inner tank 26A generates ultrasonic energy to the water while a continuous supply of water is introduced into the tank 20. As a result, a thin layer of water spray 36 that is ultrasonically energised forms on the surface of the water in the tank 20. Water overflowing from the tank 20 is collected into an outer tank 22 and drained away. Using the arrangement of this embodiment of the invention, the electronic packages 12 may be cleaned directly by the water spray 36 at the surface of the water, and there need not be a platform interfaced between the water in the tank 20 and the electronic packages 12.

Figure 5:
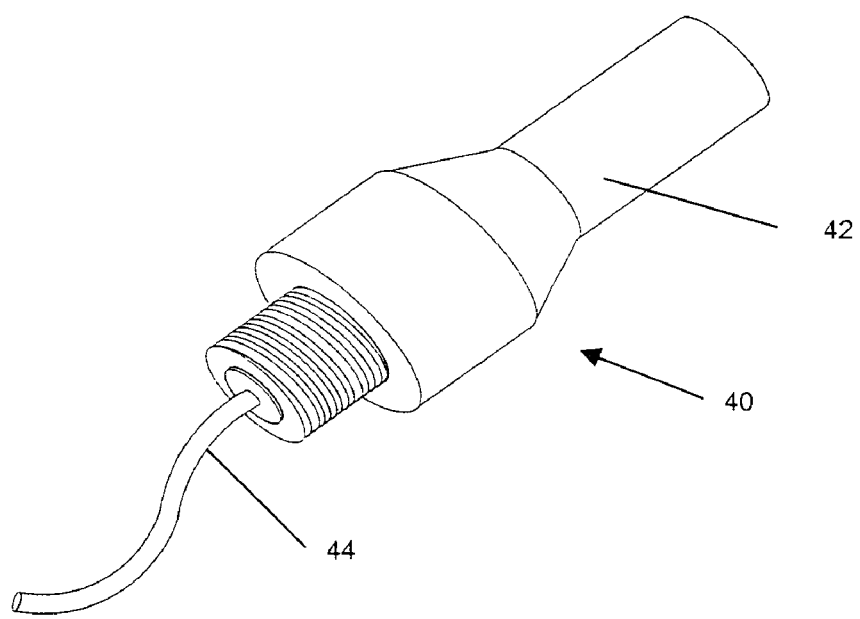
FIG. 5 shows a typical ultrasound resonator which may be used with the invention.

FIG. 5 shows a typical ultrasound resonator which may be used with the invention. It comprises an ultrasonic transducer 42, which provides resonance energy, and a power cable 44 to transmit electrical power to the ultrasonic transducer 42.

More thorough cleaning of the bottom surfaces of packages would be more likely to result from the invention when compared to merely using plain running water or water jets in conjunction with using the nesting approach of handling electronic packages.

The method of the invention is one that can be easily adapted to the non-nesting approach of handling electronic packages. This is desirable as the non-nesting approach enjoys the advantages of simple design and small package handling capability as compared to the nesting approach.

As such, it is a cost effective cleaning solution, which is capable of less water and energy consumption as compared to using other cleaning means such as high-pressure water jets.

Although the described embodiments relate primarily to the cleaning of sawn packages, it should be appreciated that the invention can also be applied to the cleaning of substrates before separation.

The invention described herein is susceptible to variations, modifications and/or additions other than those specifically described and it is to be understood that the invention includes all such variations, modifications and/or additions which fall within the spirit and scope of the above description.

The invention claimed is:

1. Apparatus for cleaning a plurality of electronic components, comprising:
    a tank for containing a cleaning fluid:
    an ultrasonic resonator mountable in communication with the cleaning fluid for imparting ultrasonic energy thereto:
    a support platform positionable over a top surface of the cleaning fluid and having a first surface that faces the top surface of the cleaning fluid and a second surface on an opposite side thereof for supporting the electronic components, and further including fluid inlets that are in communication with the cleaning fluid for diffusing cleaning fluid to said second surface of the support platform on which the electronic components are supported; and
    a cleaning fluid supply system for generating a continuous flow of cleaning fluid into the tank for cleaning the electronic components supported on said second surface.

2. Apparatus as claimed in claim 1, wherein the ultrasonic resonator is immersed into the cleaning fluid inside the tank.

3. Apparatus as claimed in claim 1, wherein the ultrasonic resonator is mounted to an external surface of the tank.

4. Apparatus as claimed in claim 1, wherein the continuous flow of cleaning fluid generated by the cleaning fluid supply system maintains the top surface of the cleaning fluid at a level higher than a rim of the tank, whereby cleaning fluid continuously overflows out of the tank.

5. Apparatus as claimed in claim 4, including an outer tank arranged adjacent to the tank, which is configured to collect cleaning fluid overflowing from the tank.

6. Apparatus as claimed in claim 1, wherein the support platform is mounted onto a rim of the tank.

7. Apparatus as claimed in claim 1, including fluid outlets in the support platform for draining cleaning fluid away from the surface of the support platform on which the electronic components are supported.

8. Apparatus as claimed in claim 1, wherein the cleaning fluid supply system is adapted to supply an adequate flow of cleaning fluid to the tank such as to maintain a substantially uniform amount of cleaning fluid in contact with the electronic components on the second surface of the support platform.

9. Apparatus as claimed in claim 1, including a transferring device operative to position the electronic components onto the surface of the support platform.

10. Apparatus as claimed in claim 9, including a moving mechanism for repeatedly moving the electronic components laterally relative to the top surface of the cleaning fluid that is in contact with the electronic components.

11. Apparatus as claimed in claim 1, wherein the frequency of ultrasonic energy supplied by the ultrasonic transducer is 20 to 80 kHz.

12. Apparatus as claimed in claim 1, wherein the tank is made from stainless steel or other stable metal.

13. Apparatus as claimed in claim 1, wherein the platform is made of aluminum with hard anodizing or stainless steel or other stable metal.

14. Method for cleaning a plurality of electronic components, comprising the steps of:
    providing a tank containing a cleaning fluid;
    ultrasonically charging the cleaning fluid;
    supporting the electronic components on a surface of a support platform that faces away from a top surface of the cleaning fluid;

diffusing cleaning fluid from the tank to the surface of the support platform on which the electronic components are supported; and generating a continuous flow of cleaning fluid into the tank for cleaning the electronic components supported on said platform.

15. Method as claimed in claim 14, including immersing an ultrasonic resonator into the cleaning fluid inside the tank for ultrasonically charging the cleaning fluid.

16. Method as claimed in claim 14, including mounting an ultrasonic resonator on an external surface of the tank for ultrasonically charging the cleaning fluid.

17. Method as claimed in claim 14, wherein the step of generating a continuous flow of cleaning fluid into the tank includes maintaining the top surface of the cleaning fluid at a level higher than the rim of the tank, whereby cleaning fluid overflows out of the tank.

18. Method as claimed in claim 17, including collecting cleaning fluid overflowing from the tank with another tank for drainage.

19. Method as claimed in claim 14, wherein the support platform is mounted onto a rim of the tank.

20. Method as claimed in claim 14, including draining cleaning fluid away from the surface of the support platform on which the electronic components are supported.

21. Method as claimed in claim 14, including the step of maintaining a substantially uniform amount of cleaning fluid in contact with the electronic components on the surface of the support platform by providing an adequate supply of cleaning fluid to the tank.

22. Method as claimed in claim 14, including repeatedly moving the electronic components laterally relative to the top surface of the cleaning fluid that is in contact with the electronic components.

23. Method as claimed in claim 14, wherein the frequency of ultrasonic energy charged to the cleaning fluid is 20 to 80 kHz.

\* \* \* \* \*